US006949146B2

(12) United States Patent
Cheung et al.

(10) Patent No.: US 6,949,146 B2
(45) Date of Patent: Sep. 27, 2005

(54) ULTRASONIC CLEANING MODULE FOR SINGULATED ELECTRONIC PACKAGES

(75) Inventors: Yiu Ming Cheung, Kwai Chung (CN); Chak Tong Albert Sze, Kwai Chung (CN)

(73) Assignee: ASM Assembly Automation LTD (HK)

( * ) Notice: Subject to any disclaimer, the term of this patent is extended or adjusted under 35 U.S.C. 154(b) by 236 days.

(21) Appl. No.: 10/413,602

(22) Filed: Apr. 14, 2003

(65) Prior Publication Data

US 2003/0200987 A1 Oct. 30, 2003

Related U.S. Application Data

(60) Provisional application No. 60/377,018, filed on Apr. 30, 2002.

(51) Int. Cl.$^7$ .................................................. B08B 3/12
(52) U.S. Cl. .......................... 134/1; 134/13; 134/95.2; 134/95.3; 134/184; 134/198
(58) Field of Search ............................ 134/1, 1.3, 95.2, 134/95.3, 102.3, 172, 184, 186, 198

(56) References Cited

U.S. PATENT DOCUMENTS

| 5,803,797 | A | * | 9/1998 | Piper | 451/182 |
| 5,927,306 | A | * | 7/1999 | Izumi et al. | 134/155 |
| 6,050,276 | A |   | 4/2000 | Harada et al. | 131/121 |
| 6,386,191 | B1 |  | 5/2002 | Yoshimura et al. | 125/35 |
| 6,431,184 | B1 | * | 8/2002 | Taniyama | 134/1.3 |
| 6,730,176 | B2 | * | 5/2004 | Kuyel | 134/1 |
| 6,746,022 | B2 | * | 6/2004 | Cheung et al. | 279/3 |

FOREIGN PATENT DOCUMENTS

JP      2001-085449     3/2001

* cited by examiner

Primary Examiner—Michael Barr
Assistant Examiner—Saeed T. Chaudhry
(74) Attorney, Agent, or Firm—Ostrolenk, Faber, Gerb & Soffen, LLP

(57) ABSTRACT

The invention provides an ultrasonic cleaning module and a method for cleaning singulated electronic packages. The module comprises a cutting chuck having a surface with a plurality of cutting recesses defined in it for enabling a cutting device to separate individual electronic packages from a substrate having a plurality of electronic packages on the surface of the chuck. A pulsator nozzle is supported above the chuck and the separated electronic packages on the chuck such that the pulsator nozzle may emit fluid toward the packages. An ultrasonic generator is associated with the nozzle that is adapted to ultrasonically energize fluid that passes through the nozzle to enhance cleaning of the packages.

25 Claims, 4 Drawing Sheets

ULTRASONIC CLEANING MODULE FOR SINGULATED ELECTRONIC PACKAGES

CROSS REFERENCE TO RELATED APPLICATION

This application claims the benefit and priority of U.S. Provisional Application No. 60/377,018 filed Apr. 30, 2002, and entitled PULSE JET ULTRASONIC CLEANING MODULE, the disclosure of which is incorporated herein by reference.

FIELD OF INVENTION

The invention relates to the cleaning of singulated semiconductor or electronic packages using cleaning fluid ejected onto the packages.

BACKGROUND AND PRIOR ART

In most semiconductor manufacturing techniques, a number of individual electronic packages, such as semiconductor Chip Scale Packages (CSP) are formed on a single substrate. These individual packages have to be singulated or separated before use. One method of substrate singulation is to use a dicing saw to cut the substrate when it is mounted on a cutting chuck. Each substrate typically consists of either an array of integrated circuit devices or sections of multiple arrays called panels. These panels may be arranged in groups of three to five that are equally spaced along the length of the substrate. The dicing process produces arrays of sawn or singulated electronic packages which need to undergo further cleaning, rinsing and drying processes. The said processes should preserve the relative positions and orientations of these singulated packages and must not cause packages to tilt and overlap in order not to create handling difficulties during subsequent processes along an assembly line.

One way of cleaning and drying singulated substrate is by the use of a pressurized water nozzle and air blower wherein the singulated substrate is mounted on a holding nest and covered with porous material. However, such pressure-rinse nozzle cleaning causes difficulties in humidity control, thus incurring overheads in drying time of the singulated substrate and may affect the circuitry of the equipment. Furthermore, it necessitates complicated design and fabrication of tools for holding the substrate in position within a pressurized chamber to carry out rinsing. Another way is to use an ultrasonic tank, wherein the singulated substrate is mounted on a nesting structure, covered, and is immersed in an ultrasonic cleaning liquid. However, the set-up of the said ultrasonic tank is complicated and usually results in longer processing time, longer drying time and difficulties in contamination management of the ultrasonic cleaning liquid. In addition, the driving frequency of such a conventional ultrasonic tank may not be appropriate for cleaning the wire bonded electronic devices. A third way is to use centrifugal cleaning. A singulated substrate is held on a carrier by means of vacuum. The carrier then spins quickly and the substrate is rinsed by pressurized water nozzles and then dried by the spinning motion. However, water and debris will diffuse through the gaps in the singulated substrate and be trapped underneath the substrate due to the vacuum force of the carrier. Eventually, watermarks and contamination are formed on surfaces of the singulated substrate.

There is a need for an improved process to clean the singulated substrate down to submicron levels and to shorten the cycle time for the entire cleaning process.

SUMMARY OF THE INVENTION

It is an object of the invention to seek to provide an improved module and method for cleaning a plurality of electronic packages in order to obviate some of the problems of the prior art.

According to a first aspect of the invention, there is provided an ultrasonic cleaning module comprising a cutting chuck having a surface with a plurality of cutting recesses defined in it for enabling a cutting device to separate individual electronic packages from a substrate having a plurality of electronic packages on the surface of the chuck; a pulsator nozzle supported above the chuck and the separated electronic packages on the chuck such that the pulsator nozzle may emit fluid toward the packages; and an ultrasonic generator associated with the nozzle that is adapted to ultrasonically energize fluid that passes through the nozzle.

According to a second aspect of the invention, there is provided a method of forming electronic packages from a common substrate having a plurality of electronic packages and cleaning the electronic packages, comprising placing a substrate of electronic packages on a surface of a chuck; holding the substrate to the chuck surface; separating the substrate into individual electronic packages while holding the substrate and packages to the chuck; thereafter directing a stream of fluid onto the separated electronic packages through a pulsator nozzle and activating an ultrasonic generator to apply ultrasonic energy to the fluid that passes through the nozzle.

It would be convenient hereinafter to describe the invention in greater detail by reference to the accompanying drawings that illustrate one embodiment of the invention. The particularity of the drawings and the related description is not to be understood as superseding the generality of the broad identification of the invention as defined by the claims.

DETAILED DESCRIPTION OF THE PREFERRED EMBODIMENT OF THE INVENTION

Figure 1:
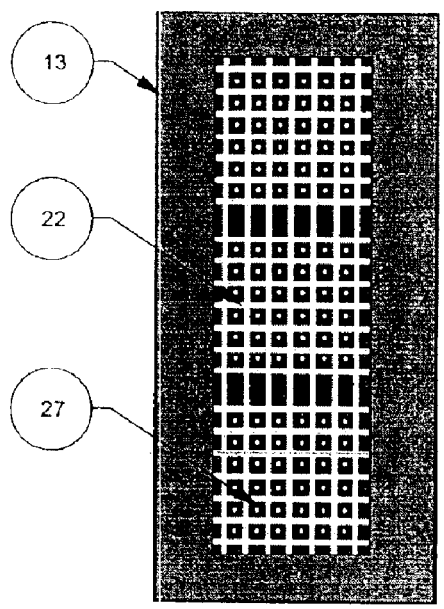
FIG. 1 shows a plan view of a vacuum cutting chuck for holding a substrate.

Referring to FIG. 1, shows a plan view of a vacuum cutting chuck 13 for holding a substrate. The cutting chuck 13 includes rows and columns of patterned cutting recesses 22 that allow a cutting saw (not shown) to singulate a substrate having a plurality of electronic packages. The arrangement of these cutting recesses 22 is designed according to the arrangement of the electronic packages in the unsingulated substrate 28. The cutting chuck 13 is formed with vacuum holes 27 located at positions of each electronic package to be separated such as to hold the individual packages 1 onto the chuck 13 after separation.

Figure 2:
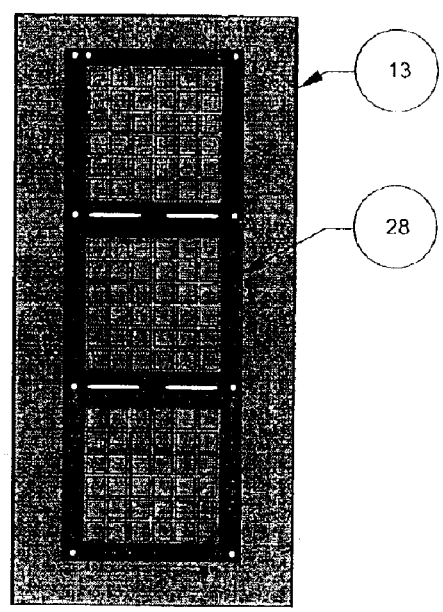
FIG. 2 shows a plan view of the vacuum cutting chuck with a substrate comprising three panels mounted thereon.

FIG. 2 shows a plan view of the vacuum cutting chuck 13 with an unsingulated substrate 28 comprising three panels of electronic packages mounted thereon.

Figure 3:
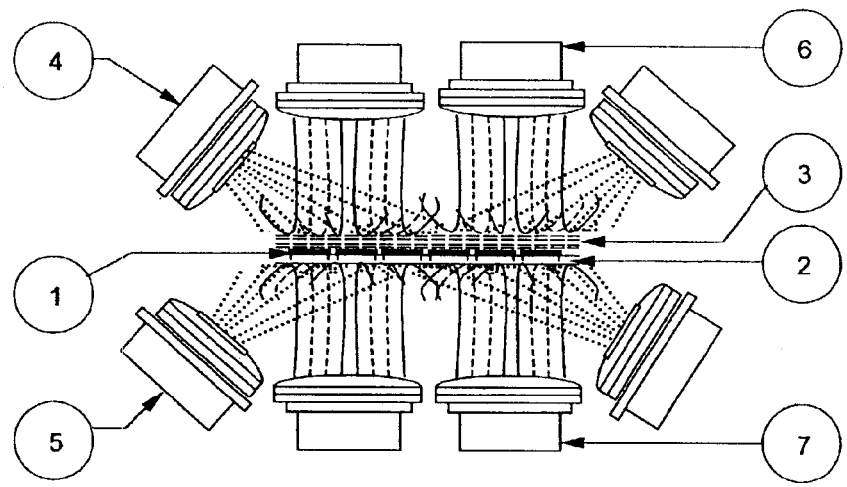
FIG. 3 shows a sectional view of a prior art cleaning apparatus using pressurised water nozzle cleaning and air-drying of a singulated substrate.

FIG. 3 shows a sectional view of a prior art cleaning apparatus using pressurised water nozzle cleaning and air-drying of a singulated substrate 1 of electronic packages. The singulated substrate 1 is mounted on a nesting tray 2 and covered with porous material 3. The top water rinse nozzles 6 and bottom rinse nozzles 7 spray pressurised water onto the singulated substrate 1, after which the top air nozzles 4 and the bottom air nozzles 5 blow-dry the substrate. However, the blow-drying process produces mist, which in turn increases the surrounding humidity and affects the drying time of the singulated substrate 1. The nesting tray 2 has a nesting design that uses partitions for holding the singulated substrate 1. These partitions hold the substrate 1 but could interrupt the water spray, thus resulting in poor cleaning since the substrate 1 is partially covered by the partitions.

Figure 4:
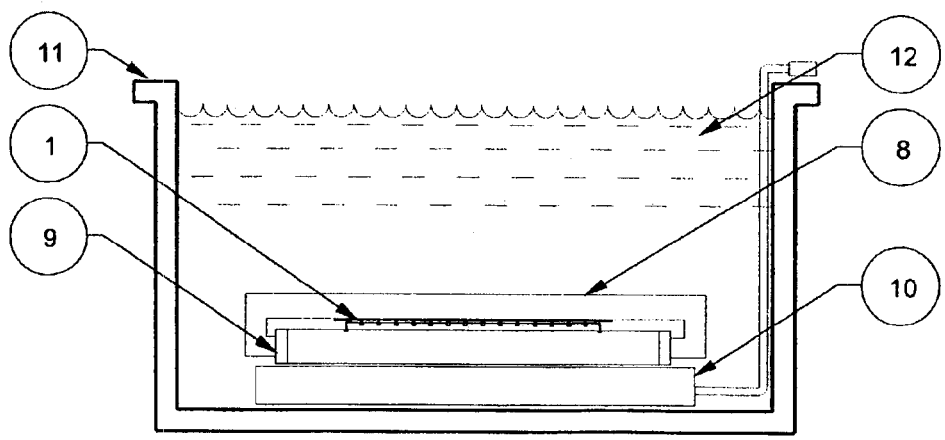
FIG. 4 shows a sectional view of a prior art cleaning apparatus with a singulated substrate immersed in a container of cleaning fluid.

FIG. 4 shows a sectional view of a prior art cleaning apparatus with a singulated substrate 1 immersed in an ultrasonic cleaning tank 11 containing cleaning fluid. The singulated substrate 1 is mounted on a carrier 9, covered with a cover 8, and placed on an ultrasonic transducer 10 inside the ultrasonic tank 11 with ultrasonic cleaning liquid 12. Such tank immersion is inefficient and takes a great deal of time to operate and maintain, due to the number of handling sequences and accumulation of debris or contaminant particles inside the tank where good circulation of clean deionised water is needed. This technique may also not be suitable since most of the driving ultrasonic frequencies for these tanks are at approximately 40 kHz which is a level close to the resonance frequencies of bonding wires in electronic devices, and may affect the wire bonded electronic devices in the substrate 1.

Figure 5:
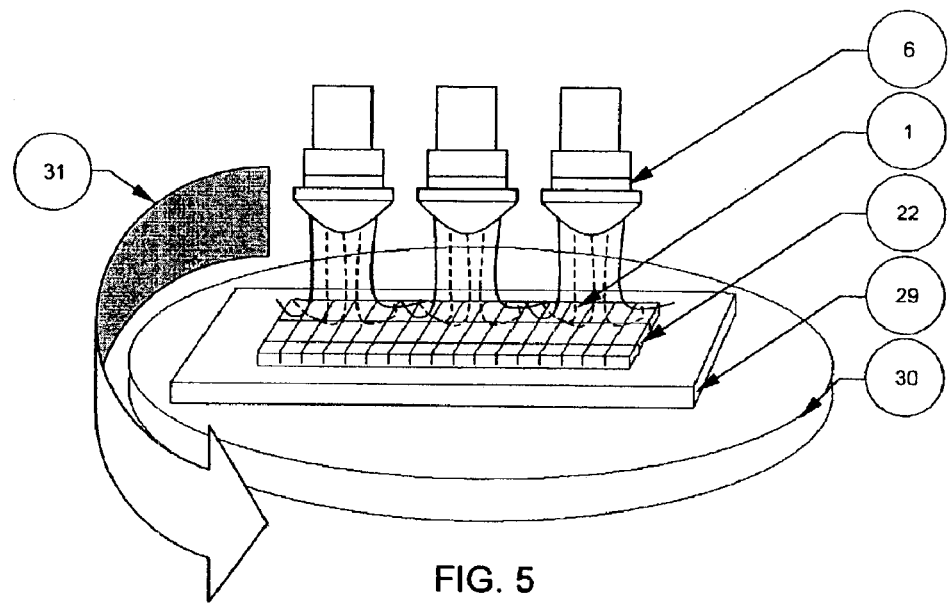
FIG. 5 shows an isometric view of a prior art cleaning apparatus using centrifugal cleaning to clean a singulated substrate held on a vacuum chuck.

FIG. 5 shows an isometric view of a prior art cleaning apparatus using centrifugal cleaning to clean a singulated substrate 1 held on a vacuum chuck. The singulated substrate 1 is mounted onto a carrier 29 which is in turn mounted onto a centrifugal table 30. Pressurised water nozzles 6 produce water jets to rinse the singulated substrate 1 held by vacuum on the carrier 29. Thereafter, the centrifugal table 30 spins in a certain direction 31 to dry the substrate 1. However, the said rinsing and spinning steps result in contamination and watermarks on the singulated substrate 1. The combined effect of holding the singulated substrate 1 by vacuum and the centrifugal spinning 31 provides a driving force for the water and debris to diffuse through gaps 22 in the singulated substrate 1, which leads to surface contamination.

Figure 6:
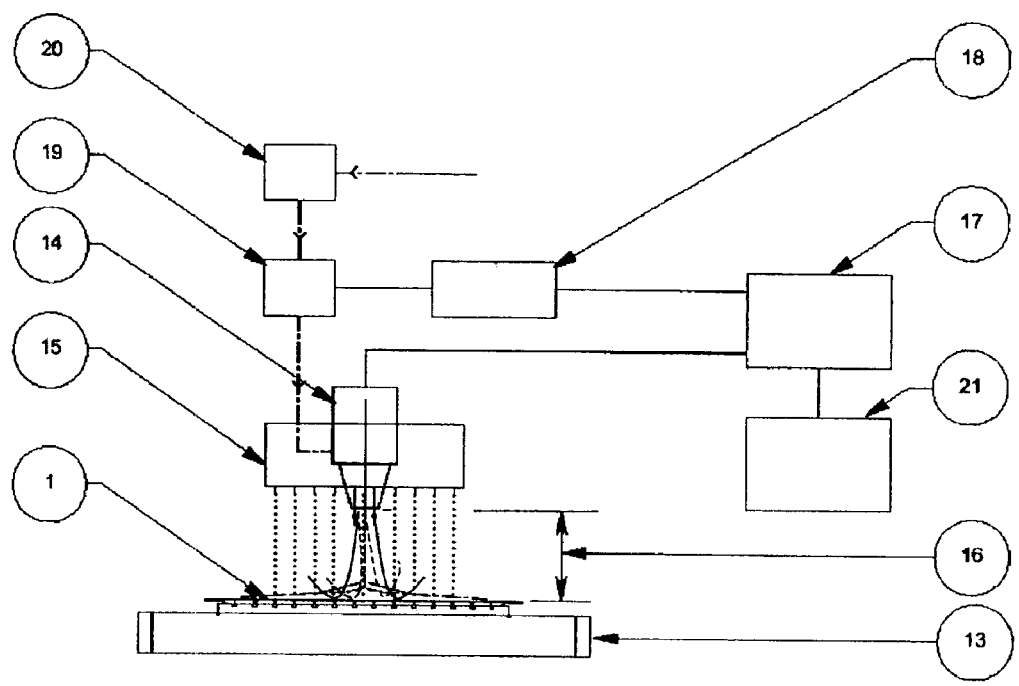
FIG. 6 is a schematic diagram illustrating an ultrasonic cleaning module for cleaning a singulated substrate according to a preferred embodiment of the invention.
Figure 7:
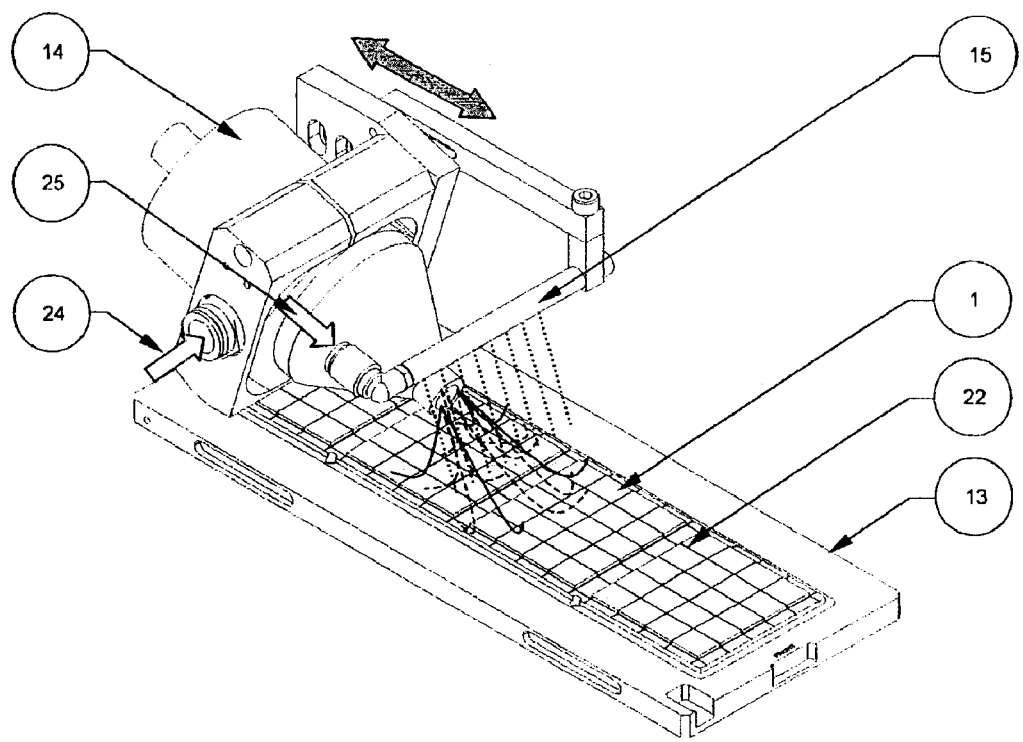
FIG. 7 is an isometric view of the ultrasonic cleaning module for cleaning a singulated substrate when in use.

FIG. 6 is a schematic diagram illustrating an ultrasonic cleaning module for cleaning a singulated substrate 1 according to a preferred embodiment of the invention, whereas FIG. 7 is an isometric view of the ultrasonic cleaning module for cleaning a singulated substrate when in use. The substrate 28, 1 has a plurality of electronic packages. A cutting chuck 13 holds the substrate 28, 1 before and after separation of its electronic packages. The cutting chuck 13 has a plurality of cutting recesses defined in it for enabling a cutting device, such as a dicing saw, to separate individual electronic devices from the substrate 28 on the surface of the chuck 13. The surface of the chuck 13 is preferably made of an elastomeric material, such as an antistatic rubber material, which allows the substrate 28 to conform to the surface and enhances holding efficiency of the substrate 28 to the chuck 13. Moreover, such elastomeric material promotes frictional cleaning of electronic packages by rubbing motion between the electronic packages and the surface of the chuck 13, when the singulated substrate 1 is slid along the surface of the chuck 13 as they are removed from the chuck 13.

Following the separation of the electronic packages from the substrate, individual electronic packages of the singulated substrate 1 remain held onto the cutting chuck 13 by vacuum suction through vacuum means. The vacuum means may comprise vacuum holes located in the cutting chuck 13 adapted to hold an entire substrate of electronic packages before separation of the electronic packages from the substrate 28, and thereafter to hold individual packages on the chuck 13 after separation of the substrate 28 into individual electronic packages.

A pulsator nozzle 14 is supported above the chuck and the separated electronic packages of the singulated substrate 1 on the chuck such that the pulsator nozzle 14 may emit energized fluid toward the packages. An ultrasonic generator 17 is associated with the pulsator nozzle 14 such that fluid flow through the pulsator nozzle 14 is energized by the ultrasonic generator 17. The ultrasonic generator 17 operates at an ultrasonic frequency that can energize the stream of fluid when it passes through the nozzle. The fluid may be deionised water 24. A deionised water valve 20 is turned on and deionised water 24 passes through the pulsator nozzle 14 (for example, the W-357P-50 pulsator nozzle from Honda Electronics Co Ltd) which moves in a back and forth direction above the cutting chuck 13 while directing deionised water at the singulated substrate 1.

The nozzle is tilted at an angle, preferably not more than 30 degrees to the vertical, and is held preferably at 5 to 20 mm in height 16 above the singulated substrate 1. A flow sensor 19 and digital flow transmitter 18 serve to detect a rate of fluid flow. The rate of-fluid flow is preferably 3.5 liters per minute or higher. Therefore, the flow sensor 19 and digital flow transmitter 18 is preferably programmed to detect a minimum water flow of 3.5 liters per minute before it initiates a signal to trigger the ultrasonic generator 17. The deionised water 24 flows through the pulsator nozzle 14 with the ultrasonic generator 17 at the frequency in the order of hundreds of kilohertz. Preferably, the frequency of ultrasonic energy generated is approximately 400 kHz, which is far from typical resonance frequencies of bonding wires in the electronic devices. Ultrasonic energy is transferred to the water molecules in the laminar stream of deionised water 24 exiting from the pulsator nozzle 14 which will carry ultrasonic energy. When the singulated substrate 1 is brought under the path of the flowing medium, a high level of cleaning occurs for the removal of particles of submicron to micron size, thus removing the dust particles formed during the substrate singulation step.

After the cleaning process, the deionised water supply is turned off. An air dryer 15, which may be in the form of air knives or air nozzles, move back and forth at a position directly over the cutting chuck 13 and singulated substrate 1 to direct air at the singulated substrate 1 to blow away or displace the water remaining on the surfaces of the substrate 1.

The invention described herein is susceptible to variations, modifications and or additions other than those specifically described and it is to be understood that the invention includes all such variations, modifications and/or additions which fall within the spirit and scope of the above description.

What is claimed is:

1. An ultrasonic cleaning module comprising:
   a cutting chuck having a surface with a plurality of cutting recesses defined in it for enabling a cutting device to separate individual electronic packages from a substrate mounted on the surface of the chuck having a plurality of electronic packages;
   a pulsator nozzle supported above the chuck and the separated electronic packages and operative to direct fluid onto the separated electronic packages; and
   an ultrasonic generator associated with the nozzle that is adapted to ultrasonically energize fluid that passes through the nozzle, whereby the ultrasonically energized fluid is directed onto and cleans the electronic packages after they have been separated while still mounted on the cutting chuck.

2. The module of claim 1, including an air dryer supported for moving back and forth directly over the cutting chuck and adapted to direct air at the separated electronic packages to displace fluid remaining on the electronic packages.

3. The module of claim 2, wherein the air dryer is selected from the group consisting of air knives and air nozzles.

4. The module of claim 1, wherein the pulsator nozzle is tilted at an angle that is less than 30 degrees to the vertical.

5. The module of claim 1, wherein the pulsator nozzle is supported at a height of between 5 and 20 mm above the separated electronic packages.

6. The module of claim 1, wherein a rate of fluid flow through the pulsator nozzle is generated at 3.5 liters per minute or higher.

7. The module of claim 1, wherein the fluid is deionised water.

8. The module of claim 1, wherein the frequency of ultrasonic energy generated by the ultrasonic generator is in the order of hundreds of kilohertz.

9. The module of claim 8, wherein the frequency of ultrasonic energy generated is approximately 400 kHz.

10. The module of claim 1, wherein the surface of the cutting chuck is made of an elastomeric material to enhance holding and cleaning of the substrate.

11. The module of claim 1, including vacuum means associated with the cutting chuck for holding the electronic packages to the chuck by vacuum suction.

12. The module of claim 11, wherein the vacuum means comprises vacuum holes located in the cutting chuck adapted to hold an entire substrate of electronic packages before separation of the electronic packages, and thereafter to hold individual packages on the chuck after separation of the substrate into individual electronic packages.

13. A method of forming electronic packages from a common substrate having a plurality of electronic packages and cleaning the electronic packages, comprising; placing a substrate of electronic packages on a surface of a chuck; holding the substrate to the chuck surface; separating the substrate into individual electronic packages while holding the substrate and packages to the chuck; thereafter directing a stream of fluid onto the separated electronic packages through a pulsator nozzle and activating an ultrasonic generator to apply ultrasonic energy to the fluid that passes through the nozzle.

14. The method of claim 13, further comprising the step of directing air flow over the chuck and the electronic packages to displace fluid remaining on the electronic packages.

15. The method of claim 13, wherein the step of directing air flow over the chuck and the electronic packages is a device selected from the group consisting of an air knife and air nozzles.

16. The method of claim 13, including setting the pulsator nozzle at an angle that is not more than 30 degrees to the vertical.

17. The method claim 13, including supporting the pulsator nozzle at a height of between 5 and 20 mm above the separated electronic packages.

18. The method of claim 13, including generating fluid flow through the pulsator nozzle at a rate of 3.5 liters per minute or higher.

19. The method of claim 13, wherein the fluid is deionised water.

20. The method of claim 13, including generating the frequency of ultrasonic energy in the order of hundreds of kilohertz.

21. The method of claim 20, wherein the frequency of ultrasonic energy generated is approximately 400 kHz.

22. The method of claim 13, wherein the step of separating of the substrate comprises cutting the substrate held on the chuck to form individual electronic packages.

23. The method of claim 22, further comprising holding the substrate and the separated electronic packages to the chuck by vacuum holding of the substrate and the individual electronic packages.

24. The method of claim 13, further including the step of sliding the substrate along the surface of the chuck while removing the substrate from the chuck to frictionally clean the substrate.

25. The method of claim 24, wherein the surface of the chuck is made of an elastomeric material.

* * * * *